US011683937B2

(12) United States Patent
Hull et al.

(10) Patent No.: US 11,683,937 B2
(45) Date of Patent: Jun. 20, 2023

(54) ON-DIE FORMATION OF SINGLE-CRYSTAL SEMICONDUCTOR STRUCTURES

(71) Applicant: Micron Technology, Inc., Boise, ID (US)

(72) Inventors: Jeffery Brandt Hull, Boise, ID (US); Anish A. Khandekar, Boise, ID (US); Hung-Wei Liu, Meridian, ID (US); Sameer Chhajed, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/397,725

(22) Filed: Aug. 9, 2021

(65) Prior Publication Data
US 2023/0042701 A1 Feb. 9, 2023

(51) Int. Cl.
*H10B 53/20* (2023.01)
*H01L 21/02* (2006.01)

(52) U.S. Cl.
CPC ......... *H10B 53/20* (2023.02); *H01L 21/0257* (2013.01); *H01L 21/02488* (2013.01); *H01L 21/02532* (2013.01); *H01L 21/02592* (2013.01); *H01L 21/02595* (2013.01); *H01L 21/02645* (2013.01)

(58) Field of Classification Search
CPC ......... H01L 21/02488; H01L 21/02532; H01L 21/0257; H01L 21/02592; H01L 21/02595; H01L 21/02645
See application file for complete search history.

(56) References Cited

U.S. PATENT DOCUMENTS

2015/0028280 A1* 1/2015 Sciarrillo ............. H10N 70/235
257/4

OTHER PUBLICATIONS

Hsieh et al., "Monolithic 3D BEOL FinFET switch arrays using location-controlled-grain technique in voltage regulator with better FOM than 2D regulators," 2019 IEEE International Electron Devices Meeting (IEDM), 2019, pp. 3.1.1-3.1.4, doi: 10.1109/IEDM19573. 2019.8993441."https://ieeexplore.ieee.org/document/8993441".

(Continued)

*Primary Examiner* — Julia Slutsker
(74) *Attorney, Agent, or Firm* — Holland & Hart LLP

(57) ABSTRACT

Methods, systems, and devices for on-die formation of single-crystal semiconductor structures are described. In some examples, a layer of semiconductor material may be deposited above one or more decks of memory cells and divided into a set of patches. A respective crystalline arrangement of each patch may be formed based on nearly or partially melting the semiconductor material, such that nucleation sites remain in the semiconductor material, from which respective crystalline arrangements may grow. Channel portions of transistors may be formed at least in part by doping regions of the crystalline arrangements of the semiconductor material. Accordingly, operation of the memory cells may be supported by lower circuitry (e.g., formed at least in part by doped portions of a crystalline semiconductor substrate), and upper circuitry (e.g., formed at least in part by doped portions of a semiconductor deposited over the memory cells and formed with a crystalline arrangement in-situ).

18 Claims, 7 Drawing Sheets

(56) References Cited

OTHER PUBLICATIONS

Nguyen et al., "Low-Temperature Deep Ultraviolet Laser Polycrystallization of Amorphous Silicon for Monolithic 3-Dimension Integration," in IEEE Electron Device Letters, vol. 42, No. 6, pp. 784-787, Jun. 2021, doi: 10.1109/LED.2021.3074627. "https://ieeexplore.ieee.org/document/9410297".

* cited by examiner

ON-DIE FORMATION OF SINGLE-CRYSTAL SEMICONDUCTOR STRUCTURES

FIELD OF TECHNOLOGY

The following relates generally to one or more systems for memory and more specifically to on-die formation of single-crystal semiconductor structures.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3 dimensional cross-point memory (3D Xpoint), not-or (NOR), and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
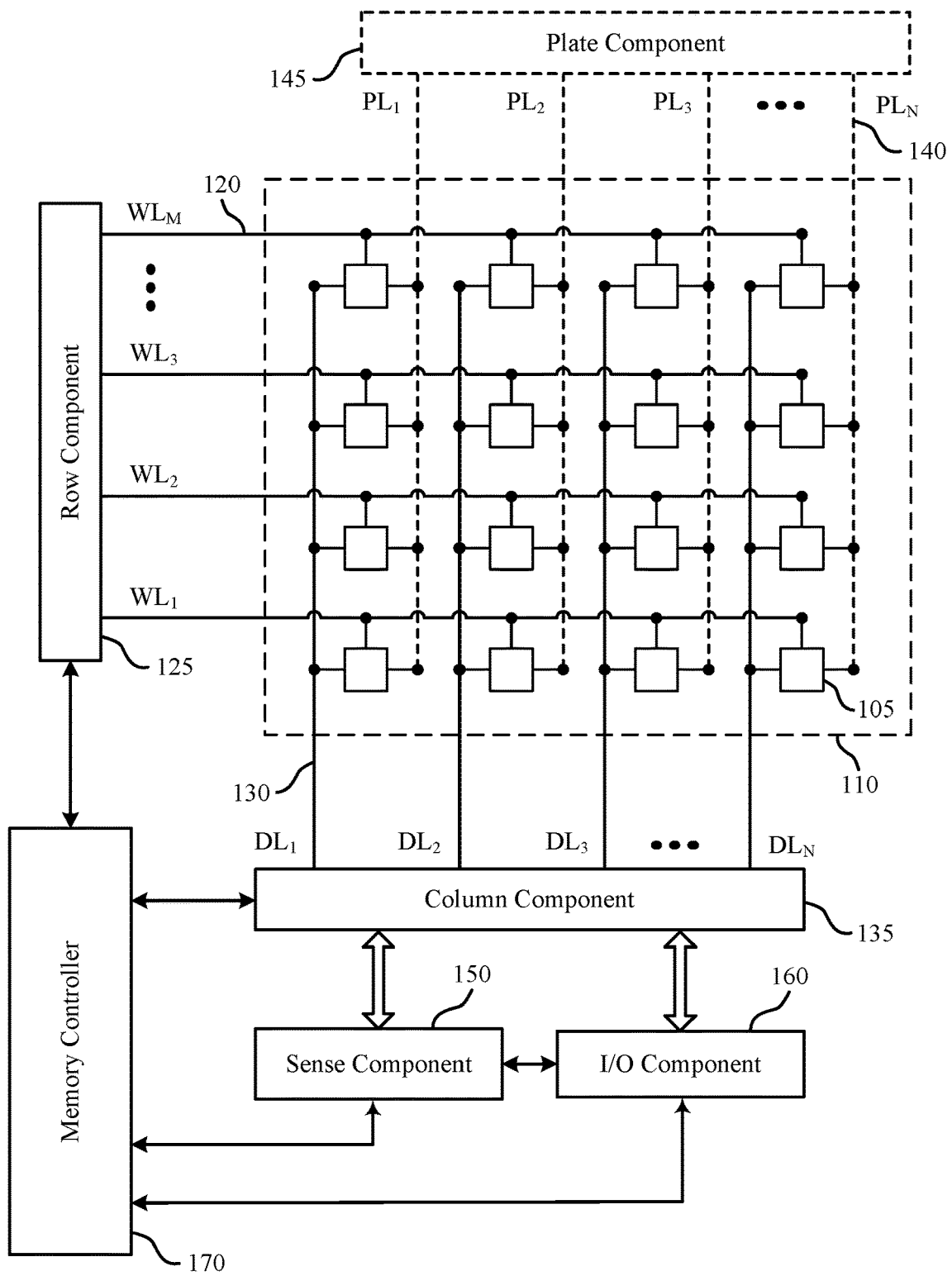
FIG. 1 illustrates an example of a memory device that supports on-die formation of single-crystal semiconductor structures in accordance with examples as disclosed herein.

Memory devices may include various arrangements of memory arrays and supporting circuitry formed with or over a substrate. For example, a memory device may include one or more decks of memory arrays over a substrate, where a deck may refer to a plane or level of memory cells (e.g., of one or more memory arrays) above the substrate and, in some examples, generally parallel to the substrate. In some examples, circuitry that supports accessing or operating the memory arrays may be located below the memory arrays, which may refer to a location that is at least in part between the memory arrays and the substrate (e.g., in a vertical direction). For example, sensing circuitry, decoding circuitry, periphery circuitry, or other logic and circuitry may be located below the memory arrays but at least in part above the substrate and, in some examples, may include transistors that are formed at least in part by doping portions of the substrate (e.g., substrate-based transistors, transistors having channels formed from doped crystalline silicon or another semiconductor substrate). But as memory devices scale with and have a greater quantity of layers or decks of memory arrays above a substrate, the area of a substrate used for such substrate-based circuitry may increase, which may lead to additional limitations (e.g., related to the limited area of a substrate to support a growing quantity of decks and, by extension, a growing quantity and area for such substrate-based circuitry, related to routing challenges associated with locating some circuitry below a stack of decks but not above the stack of decks). Moreover, some operations to form a semiconductor material in a crystalline arrangement above other structures of a semiconductor die (e.g., above one or more decks or memory cells or other circuitry formed over a semiconductor substrate) may result in degradation of the other structures, or such operations may be relatively complex, among other challenges.

In accordance with examples as disclosed herein, a memory device may include one or more decks of memory cells and circuitry for accessing or operating the memory cells (e.g., semiconductor circuitry, transistor circuitry, complementary metal-oxide-semiconductor (CMOS) circuitry) with some of the circuitry being located above the one or more decks and some being located below the one or more decks. For example, the memory device may include lower substrate-based circuitry formed, in some examples, at least in part by doping portions of a lower semiconductor substrate (e.g., a base substrate, a silicon substrate, a crystalline semiconductor substrate, a chip or wafer) to form a first set of components, such as transistors. Above the lower substrate-based circuitry, the memory device may include one or more decks of memory cells and upper circuitry (e.g., transistors of the upper circuitry) formed, in some examples, at least in part by a semiconductor that is deposited over the one or more decks. The deposited semiconductor may be formed into a crystalline arrangement based on nearly or partially melting the semiconductor material, such that unmelted portions may remain in the semiconductor material (e.g., as "seeds" as described herein) from which respective crystalline atomic arrangements may grow (e.g., during cooling of the semiconductor material). Channel portions of one or more transistors may be formed at least in part by doping regions of the crystalline arrangement of the deposited semiconductor material. Accordingly, operation of the one or more decks of memory cells may be supported by lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

Features of the disclosure are initially described in the context of a memory device and related circuitry as described with reference to FIGS. 1 and 2. Features of the disclosure are described in the context of a memory device layout and illustrative fabrication techniques with reference to FIGS. 3-5. These and other features of the disclosure are further illustrated by and described with reference to flowcharts that relate to on-die formation of single-crystal semiconductor structures as described with reference to FIGS. 6 and 7.

FIG. 1 illustrates an example of a memory device 100 that supports single-crystal transistors for memory devices in accordance with examples as disclosed herein. The memory device 100 may also be referred to as an electronic memory apparatus. The memory device 100 may include memory cells 105 that are programmable to store different logic states. In some cases, a memory cell 105 may be programmable to store two logic states, denoted a logic 0 and a logic 1. In some cases, a memory cell 105 may be programmable to store more than two logic states (e.g., as a multi-level cell). The set of memory cells 105 may be part of a memory array 110 of the memory device 100, where, in some examples, a memory array 110 may refer to a contiguous tile of memory cells 105 (e.g., a contiguous set of elements of a semiconductor chip).

In some examples, a memory cell 105 may store an electric charge representative of the programmable logic states (e.g., storing charge in a capacitor, capacitive memory element, capacitive storage element). In one example, a charged and uncharged capacitor may represent two logic states, respectively. In another example, a positively charged (e.g., a first polarity, a positive polarity) and negatively charged (e.g., a second polarity, a negative polarity) capacitor may represent two logic states, respectively. DRAM or FeRAM architectures may use such designs, and the capacitor employed may include a dielectric material with linear or para-electric polarization properties as an insulator. In some examples, different levels of charge of a capacitor may represent different logic states, which, in some examples, may support more than two logic states in a respective memory cell 105. In some examples, such as FeRAM architectures, a memory cell 105 may include a ferroelectric capacitor having a ferroelectric material as an insulating (e.g., non-conductive) layer between terminals of the capacitor. Different levels or polarities of polarization of a ferroelectric capacitor may represent different logic states (e.g., supporting two or more logic states in a respective memory cell 105).

In some examples, a memory cell 105 may include or otherwise be associated with a configurable material, which may be referred to as a material memory element, a material storage element, a material portion, and others. The configurable material may have one or more variable and configurable characteristics or properties (e.g., material states) that may represent different logic states. For example, a configurable material may take different forms, different atomic configurations, different degrees of crystallinity, different atomic distributions, or otherwise maintain different characteristics that may be leveraged to represent one logic state or another. In some examples, such characteristics may be associated with different electrical resistances, different threshold characteristics, or other properties that are detectable or distinguishable during a read operation to identify a logic state written to or stored by the configurable material.

In some cases, a configurable material of a memory cell 105 may be associated with a threshold voltage. For example, electrical current may flow through the configurable material when a voltage greater than the threshold voltage is applied across the memory cell 105, and electrical current may not flow through the configurable material, or may flow through the configurable material at a rate below some level (e.g., according to a leakage rate), when a voltage less than the threshold voltage is applied across the memory cell 105. Thus, a voltage applied to memory cells 105 may result in different current flow, or different perceived resistance, or a change in resistance (e.g., a thresholding or switching event) depending on whether a configurable material portion of the memory cell 105 was written with one logic state or another. Accordingly, the magnitude of current, or other characteristic (e.g., thresholding behavior, resistance breakdown behavior, snapback behavior) associated with the current that results from applying a read voltage to the memory cell 105, may be used to determine a logic state written to or stored by memory cell 105.

In the example of memory device 100, each row of memory cells 105 may be coupled with one or more word lines 120 (e.g., $WL_1$ through $WL_M$), and each column of memory cells 105 may be coupled with one or more digit lines 130 (e.g., $DL_1$ through $DL_N$). Each of the word lines 120 and digit lines 130 may be an example of an access line of the memory device 100. In general, one memory cell 105 may be located at the intersection of (e.g., coupled with, coupled between) a word line 120 and a digit line 130. This intersection may be referred to as an address of a memory cell 105. A target or selected memory cell 105 may be a memory cell 105 located at the intersection of an energized or otherwise selected word line 120 and an energized or otherwise selected digit line 130.

In some architectures, a storage component of a memory cell 105 may be electrically isolated (e.g., selectively isolated) from a digit line 130 by a cell selection component, which, in some examples, may be referred to as a switching component or a selector device of or otherwise associated with the memory cell 105. A word line 120 may be coupled with the cell selection component (e.g., via a control node or terminal of the cell selection component), and may control the cell selection component of the memory cell 105. For example, the cell selection component may be a transistor and the word line 120 may be coupled with a gate of the transistor (e.g., where a gate node of the transistor may be a control node of the transistor). Activating a word line 120 may result in an electrical connection or closed circuit between a respective logic storing component of one or more memory cells 105 and one or more corresponding digit lines 130. A digit line 130 may then be accessed to read from or write to the respective memory cell 105.

In some examples, memory cells 105 may also be coupled with one or more plate lines 140 (e.g., $PL_1$ through $PL_N$). In some examples, each of the plate lines 140 may be independently addressable (e.g., supporting individual selection or biasing). In some examples, the plurality of plate lines 140 may represent or be otherwise functionally equivalent with a common plate, or other common node (e.g., a plate node common to each of the memory cells 105 in the memory array 110). When a memory cell 105 employs a capacitor for storing a logic state, a digit line 130 may provide access to a first terminal or a first plate of the capacitor, and a plate line 140 may provide access to a second terminal or a second plate of the capacitor. Although the plurality of plate lines 140 of the memory device 100 are shown as substantially parallel with the plurality of digit lines 130, in other examples, a plurality of plate lines 140 may be substantially parallel with the plurality of word lines 120, or in any other configuration (e.g., a common planar conductor, a common plate layer).

Access operations such as reading, writing, rewriting, and refreshing may be performed on a memory cell 105 by activating or selecting a word line 120, a digit line 130, or a plate line 140 coupled with the memory cell 105, which may include applying a voltage, a charge, or a current to the respective access line. Upon selecting a memory cell 105 (e.g., in a read operation), a resulting signal may be used to determine the logic state stored by the memory cell 105. For example, a memory cell 105 with a capacitive memory element storing a logic state may be selected, and the resulting flow of charge via an access line or resulting voltage of an access line may be detected to determine the programmed logic state stored by the memory cell 105.

Accessing memory cells 105 may be controlled using a row component 125 (e.g., a row decoder), a column component 135 (e.g., a column decoder), or a plate component 145 (e.g., a plate decoder), or a combination thereof. For example, a row component 125 may receive a row address from the memory controller 170 and activate the appropriate word line 120 based on the received row address. Similarly, a column component 135 may receive a column address from the memory controller 170 and activate the appropriate digit line 130. In some examples, such access operations may be accompanied by a plate component 145 biasing one or more of the plate lines 140 (e.g., biasing one of the plate lines 140, biasing some or all of the plate lines 140, biasing a common plate).

In some examples, the memory controller 170 may control operations (e.g., read operations, write operations, rewrite operations, refresh operations) of memory cells 105 using one or more components (e.g., row component 125, column component 135, plate component 145, sense component 150). In some cases, one or more of the row component 125, the column component 135, the plate component 145, and the sense component 150 may be co-located or otherwise included with the memory controller 170. The memory controller 170 may generate row and column address signals to activate a desired word line 120 and digit line 130. The memory controller 170 may also generate or control various voltages or currents used during the operation of memory device 100.

A memory cell 105 may be read (e.g., sensed) by a sense component 150 when the memory cell 105 is accessed (e.g., in cooperation with the memory controller 170) to determine a logic state written to or stored by the memory cell 105. For example, the sense component 150 may be configured to evaluate a current or charge transfer through or from the memory cell 105, or a voltage resulting from coupling the memory cell 105 with the sense component 150, responsive to a read operation. The sense component 150 may provide an output signal indicative of the logic state read from the memory cell 105 to one or more components (e.g., to the column component 135, the input/output (I/O) component 160, to the memory controller 170).

A sense component 150 may include various switching components, selection components, transistors, amplifiers, capacitors, resistors, or voltage sources to detect or amplify a difference in sensing signals (e.g., a difference between a read voltage and a reference voltage, a difference between a read current and a reference current, a difference between a read charge and a reference charge), which, in some examples, may be referred to as latching. In some examples, a sense component 150 may include a collection of components (e.g., circuit elements) that are repeated for each of a set of digit lines 130 connected to the sense component 150. For example, a sense component 150 may include a separate sensing circuit (e.g., a separate or duplicated sense amplifier, a separate or duplicated signal development component) for each of a set of digit lines 130 coupled with the sense component 150, such that a logic state may be separately detected for a respective memory cell 105 coupled with a respective one of the set of digit lines 130.

A memory cell 105 may be set, or written, by activating the relevant word line 120, digit line 130, or plate line 140 (e.g., via a memory controller 170). In other words, a logic state may be stored in a memory cell 105. A row component 125, a column component 135, or a plate component 145 may accept data, for example, via I/O component 160, to be written to the memory cells 105. In some examples, a write operation may be performed at least in part by a sense component 150, or a write operation may be configured to bypass a sense component 150.

In the case of a capacitive memory element, a memory cell 105 may be written by applying a voltage to or across a capacitor, and then isolating the capacitor (e.g., isolating the capacitor from a voltage source used to write the memory cell 105, floating the capacitor) to store a charge in the capacitor associated with a desired logic state. In the case of ferroelectric memory, a ferroelectric memory element (e.g., a ferroelectric capacitor) of a memory cell 105 may be written by applying a voltage with a magnitude sufficient to polarize the ferroelectric memory element (e.g., applying a saturation voltage) with a polarization associated with a desired logic state, and the ferroelectric memory element may be isolated (e.g., floating), or a zero net voltage or bias may be applied across the ferroelectric memory element (e.g., grounding, virtually grounding, or equalizing a voltage across the ferroelectric memory element). In the case of a material memory architecture, a memory cell 105 may be written by applying a current, voltage, or other heating or biasing to a material memory element to configure the material according to a corresponding logic state.

In some examples, the memory device 100 may include multiple memory arrays 110 arranged in a stack of decks or levels relative to a substrate of the memory device 100 (e.g., a semiconductor substrate, a crystalline silicon substrate, a crystalline semiconductor substrate, a portion of a semiconductor chip or wafer). In some cases, circuitry that supports accessing or operating the multiple memory arrays 110 (e.g., semiconductor circuitry, transistor circuitry, CMOS circuitry) may be located below the memory arrays 110, which may refer to a location that is at least in part between the memory arrays 110 and the substrate. For example, one or more row components 125, one or more column components 135, one or more plate components 145, one or more sense components 150, or one or more I/O components 160, or any combination thereof, may be located below the memory arrays 110 and above the substrate and, in some examples, may include transistors that are formed at least in part by doping portions of the substrate (e.g., substrate-based transistors, transistors having channels formed from doped crystalline silicon or other semiconductor). When scaling the memory device 100 with a greater quantity of decks or levels of memory arrays 110, the area of a substrate used for supporting circuitry may increase, which may lead to scaling limitations (e.g., related to the limited area of a substrate to support circuitry for accessing a growing quantity of decks or levels of memory arrays 110 and, by extension, a growing quantity and area for such decoders or other supporting circuitry, related to routing challenges associated with locating certain circuitry below a stack of decks but not above the stack of decks), among other challenges. Some operations to form a semiconductor material in a crystalline arrangement above other structures of a semiconductor die (e.g., above one or more memory arrays 110) may result in degradation of the other structures, or such operations may be relatively complex, among other challenges.

In accordance with examples as disclosed herein, the memory device 100 may include one or more memory arrays 110, which may include memory arrays 110 arranged in a stack of decks formed above a substrate, and transistor circuitry formed both above and below the one or more memory arrays 110 to support accessing or operating the respective memory cells 105. For example, the memory device 100 may include lower substrate-based circuitry formed at least in part by doping portions of a semiconductor substrate (e.g., a base substrate, a silicon substrate, a crystalline semiconductor substrate, a semiconductor chip or wafer) to form a first set of transistors. Above the lower substrate-based circuitry, the memory device 100 may include one or more decks of memory cells 105 and upper circuitry (e.g., transistors of the upper circuitry) formed at least in part by a semiconductor material that is deposited over the one or more decks and formed in a crystalline arrangement based on heating and cooling of the deposited semiconductor. The deposited semiconductor may be formed into a crystalline arrangement based on nearly or partially melting the semiconductor material, such that unmelted portions may remain in the semiconductor material (e.g., as "seeds" as described herein) from which respective crystalline atomic arrangements may grow (e.g., during cooling of the semiconductor material). Channel portions of a second set of transistors (e.g., of the upper circuitry) may be formed at least in part by doping regions of the crystalline arrangement of the deposited semiconductor material. Thus, operation of the one or more decks of memory cells 105 may be supported by lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

A combination of lower substrate-based circuitry and upper circuitry using a semiconductor crystallized in-situ may support accessing or operating of the decks of memory cells 105 in accordance with various techniques. For example, circuitry associated with a row component 125, a column component 135, a plate component 145, or a sense component 150, among other components or circuitry, may be divided between or distributed among lower circuitry and upper circuitry, including various allocations of circuitry associated with operating certain decks of a stack of decks of memory arrays 110. In some examples, circuitry that is common to or shared by each deck of the stack (e.g., one or more portions of an I/O component 160, or a memory controller 170, among other components or circuitry) may be coupled with lower circuitry and upper circuitry and, in some examples, may be formed above the upper circuitry.

Implementing operating circuitry across regions of crystalline semiconductor both above and below one or more memory arrays 110 may increase an area available for such circuitry compared to memory devices that include a single level of substrate-based semiconductor circuitry. Such techniques may support the memory device 100 leveraging crystalline semiconductor materials for a greater quantity of components, or larger components, for circuitry such as sensing circuitry, decoding circuitry, or periphery circuitry, among other circuitry used for accessing or otherwise operating memory arrays 110 of the memory device 100. In some examples, implementing such circuitry in multiple levels of crystalline semiconductor may alleviate or mitigate area utilization challenges or routing challenges of a single substrate level, which may improve scaling in memory devices 100 by supporting a greater quantity of decks for a given footprint. Accordingly, utilizing multiple levels of crystalline semiconductor circuitry may enable a greater scaling of decks, or improved scaling of memory storage, among other advantages. Moreover, by implementing techniques that partially melt a deposited semiconductor to isolate crystalline seeds or other features from which an atomic arrangement may grow, certain die structures, such as specifically-formed cooling structures or crystalline nucleation sites, may be avoided, and heating of the deposited semiconductor material may be controlled in a manner that limits degradation of structures already formed below the deposited semiconductor.

Figure 2:
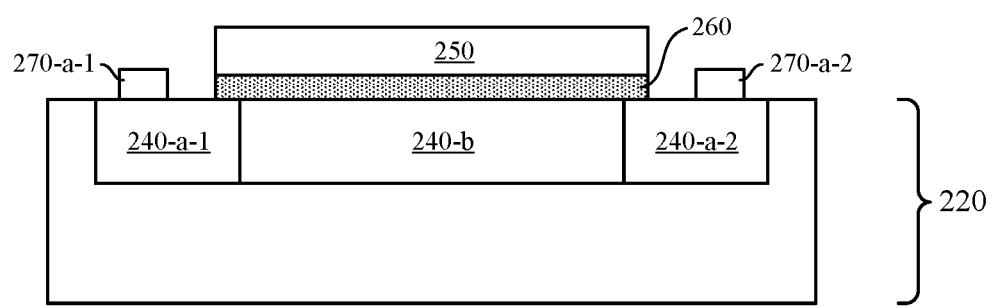
FIG. 2 illustrates an example of a transistor structure that supports on-die formation of single-crystal semiconductor structures in accordance with examples as disclosed herein.
Figure 2:

FIG. 2 illustrates an example of a transistor structure 200 that supports single-crystal transistors for memory devices in accordance with examples as disclosed herein. The transistor structure 200 illustrates an example of a transistor that is formed at least in part by portions of a semiconductor material 220 (e.g., doped portions 240 of the semiconductor material 220), and may illustrate an arrangement of features for a transistor that is configured in a planar transistor arrangement. In some examples, the semiconductor material 220, or some portion thereof, may be formed with a crystalline arrangement, which may support favorable operational characteristics of the transistor structure 200, such as improved channel or charge carrier characteristics, among other characteristics. For example, the semiconductor material 220 may be formed such that at least adjacent doped portions 240 of the semiconductor material (e.g., doped portions 240-a-1, 240-b, and 240-a-2) are formed with a same or continuous atomic arrangement (e.g., a continuous crystalline arrangement), or are formed without grain boundaries or other discontinuities between different atomic arrangements.

For illustrative purposes, aspects of the transistor structure 200 may be described with reference to an x-direction, a y-direction, and a z-direction (e.g., a height direction) of a coordinate system 210. In some examples, the z-direction may be illustrative of a direction perpendicular to a surface of a substrate (e.g., a surface in an xy-plane, a surface upon or over which other materials may be deposited, a surface of a semiconductor chip or wafer), and each of the structures, illustrated by their respective cross section in an xz-plane, may extend for some distance (e.g., length) in the y-direction.

The transistor structure 200 illustrates an example of a transistor channel, electrically coupled between a terminal 270-a-1 and a terminal 270-a-2, that may include one or more doped portions 240 of the semiconductor material 220. In various examples, one of the terminals 270-a-1 or 270-a-2 may be referred to as a source terminal, and the other of the terminals 270-a-1 or 270-a-2 may be referred to as a drain terminal, where such a designation may be based on a configuration or relative biasing of a circuit that includes the transistor structure 200. The channel (e.g., the channel portion) of the transistor may include or refer to one or more portions of the transistor structure 200 that are operable to open or close a conductive path (e.g., to modulate a conductivity, to form a channel, to open a channel, to close a channel) between a source and drain (e.g., between the terminal 270-a-1 and the terminal 270-a-2) based at least in part on a voltage of a gate (e.g., a gate terminal, a gate portion 250). In other words, a channel portion of a transistor structure may be configured to be activated, deactivated, made conductive, or made non-conductive, based at least in part on a voltage of a gate portion, such as gate portion 250. In some examples of transistor structure 200 (e.g., a planar transistor arrangement), the channel portion formed by one or more doped portions 240 of the semiconductor material 220 may support a conductive path in a generally horizontal or in-plane direction (e.g., along the x-direction, within an xy-plane, in a direction within or parallel to a surface of a substrate).

In some examples, the gate portion 250 may be physically separated from the channel portion (e.g., separated from the semiconductor material 220, separated from one or more of the doped portions 240) by a gate insulation portion 260 (e.g., a gate dielectric). Each of the terminals 270-a may be in contact with or otherwise coupled with (e.g., electrically, physically) a respective doped portion 240-a, and each of the terminals 270-a and the gate portion 250 may be formed from an electrically conductive material such as a metal or metal alloy, or a polycrystalline semiconductor (e.g., polysilicon).

In some examples, the transistor structure 200 may be operable as an n-type or n-channel transistor, where applying a relatively positive voltage to the gate portion 250 that is above a threshold voltage (e.g., an applied voltage having a positive magnitude, relative to a source terminal, that is greater than a threshold voltage) activates the channel portion or otherwise enables a conductive path between the terminals 270-a-1 and 270-a-2 (e.g., along a direction generally aligned with the x-direction within the semiconductor material 220). In such examples, the doped portions 240-a may refer to portions having n-type doping or n-type semiconductor, and doped portion 240-b may refer to portions having p-type doping or p-type semiconductor (e.g., a channel portion having an NPN configuration along the x-direction or channel direction).

In some examples, the transistor structure 200 may be operable as a p-type or p-channel transistor, where applying a relatively negative voltage to the gate portion 250 that is above a threshold voltage (e.g., an applied voltage having a negative magnitude, relative to a source terminal, that is greater than a threshold voltage) activates the channel portion or otherwise enables a conductive path between the terminals 270-a-1 and 270-a-2. In such examples, the doped portions 240-a may refer to portions having p-type doping or p-type semiconductor, and doped portion 240-b may refer to portions having n-type doping or n-type semiconductor (e.g., a channel portion having a PNP configuration along the x-direction or channel direction).

In some examples, circuitry operable to support access operations on memory cells 105 (e.g., a row component 125, a column component 135, a plate component 145, a sense component 150, a memory controller 170, or various combinations thereof) may be formed at least in part by respective sets of transistors each having the arrangement of the transistor structure 200, where each of the transistors may have a channel portion formed by respective doped portions 240 of the semiconductor material 220. Some examples of such an arrangement may be implemented in a CMOS configuration, which may refer to various examples of a complementary and symmetrical pair of a p-type transistor and an n-type transistor (e.g., for logic functions). In some examples, such transistors may leverage a crystalline arrangement of the semiconductor material 220 (e.g., a single crystalline arrangement) for various performance characteristics or manufacturing characteristics of such a material or an arrangement. For example, at least the doped portions 240 of a given transistor (e.g., doped portions 240-a-1, 240-b, and 240-a-2) may be collectively formed from a single crystal grain or other continuous atomic arrangement of the semiconductor material 220 (e.g., with relatively few or no grain boundaries or other discontinuities within at least the adjacent, contacting, or otherwise cooperative doped portions 240). However, in some examples, such structures or arrangements of transistors may be limited by an available area of a crystalline substrate (e.g., a crystalline structure of a chip or wafer underneath a memory array 110 or stack of levels or decks of memory arrays 110).

In accordance with examples as disclosed herein, a memory device 100 may include upper circuitry (e.g., transistors of the upper circuitry) formed at least in part by a semiconductor material 220 that is deposited over one or more decks of memory cells 105 and formed in a crystalline arrangement based on heating and cooling of the deposited semiconductor material 220. To support forming the deposited semiconductor material 220 in the crystalline arrangement, the deposited semiconductor may be nearly or partially melted, such that portions of the semiconductor material 220 that are not melted may act as seeds from which a crystalline atomic arrangement may grow (e.g., during cooling of adjacent semiconductor material that has been melted). The doped portions 240 of the upper circuitry transistors may be formed at least in part by doping regions of the crystalline arrangement (e.g., a single crystal grain or other continuous atomic arrangement of the semiconductor material) of the deposited semiconductor material 220. In some examples, such techniques may be leveraged for operating the one or more decks of memory cells 105 using a combination of lower circuitry, which may be formed at least in part by doped portions of a crystalline semiconductor substrate (e.g., a crystalline chip or wafer), and upper circuitry, which may be formed at least in part by doped portions of a semiconductor deposited over the one or more decks and formed with a crystalline arrangement in-situ.

Figure 3:
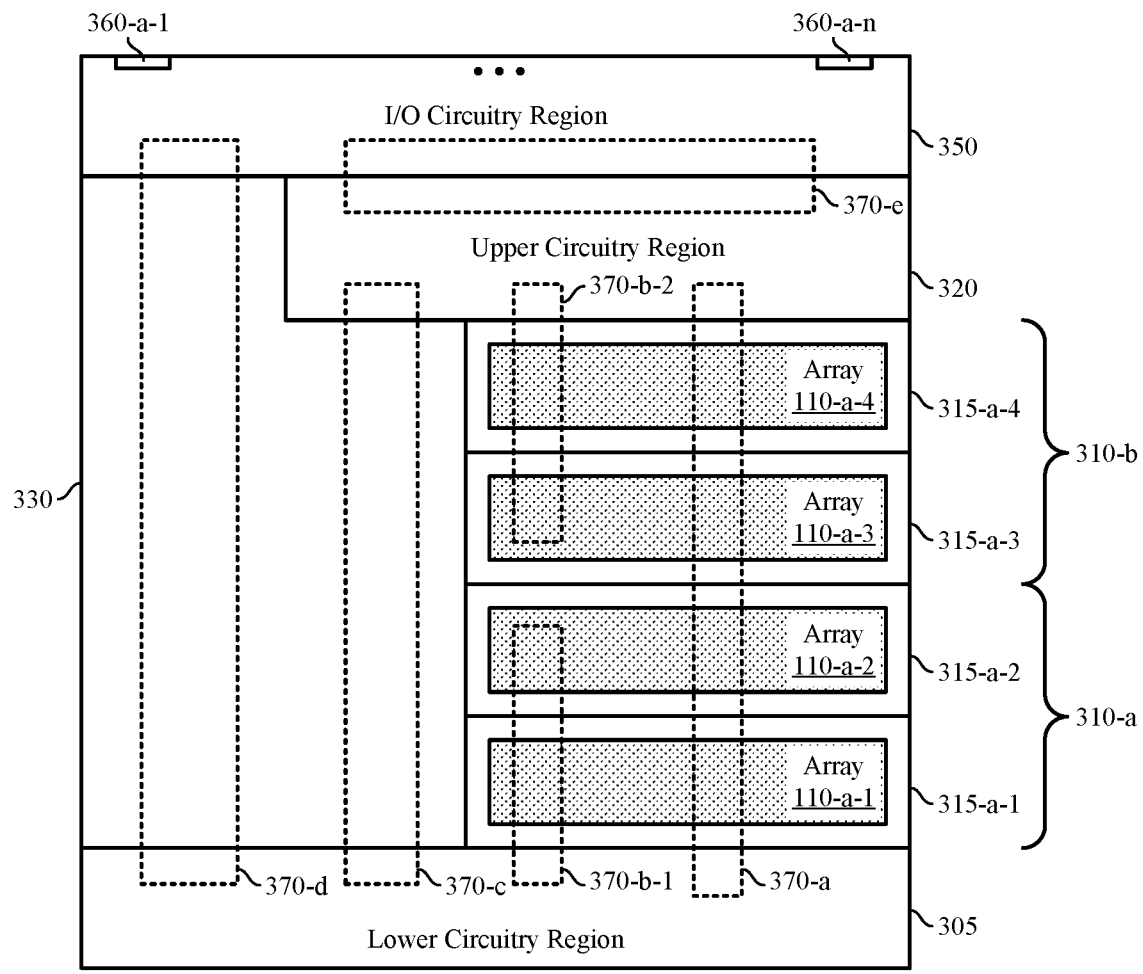
FIG. 3 illustrates a layout of a memory device that supports on-die formation of single-crystal semiconductor structures in accordance with examples as disclosed herein.
Figure 3:

FIG. 3 illustrates an example of a memory device 300 that supports single-crystal transistors for memory devices in accordance with examples as disclosed herein. The memory device 300 may be an example of a memory device 100 described with reference to FIG. 1, and may include multiple levels of semiconductor circuitry (e.g., transistor circuitry, CMOS circuitry) for accessing and operating multiple decks or levels of memory arrays 110-a. For illustrative purposes, aspects of the memory device 300 may be described with reference to an x-direction, a y-direction, and a z-direction of a coordinate system 301. In some examples, the z-direction may be illustrative of a direction perpendicular to a surface of a substrate (e.g., a surface in an xy-plane, a surface upon or over which other materials may be deposited), and each of the related regions, illustrated by their respective cross-section in an xz-plane, may extend for some distance along the y-direction. In some examples, the x-direction may be aligned with or referred to as a row direction (e.g., along a row of memory cells 105), and the y-direction may be aligned with or referred to as a column direction (e.g., along a column of memory cells 105), or vice versa.

Each of the illustrative regions of the memory device 300 may be associated with a region of components or circuitry that may be formed using various techniques. In some examples, functional components such as transistors in various configurations or arrangements within the illustrative regions may be interconnected by routing conductors (e.g., metal conductors) of the respective regions, which may include various arrangements of through-silicon vias (TSVs) or socket conductors that may be aligned along the z-direction, or various arrangements of in-plane conductors that may be aligned in one or more directions parallel to an xy-plane, or combinations thereof. Such interconnection may be associated with signal routing, or power or voltage distribution, among other functions.

The memory device 300 may include a lower circuitry region 305, which may include first (e.g., lower) set of transistors (e.g., first transistor circuitry, first CMOS circuitry). In some cases, the first set of transistors may be substrate-based transistors (e.g., formed by doping portions of a semiconductor substrate, a crystalline silicon substrate, a crystalline semiconductor substrate, a portion of a semiconductor chip or wafer). A substrate of the lower circuitry region 305 may be a base or initial substrate of the memory device 300, upon which other components or circuitry are formed, and over which another upper circuitry region 320 may be added. In some examples, transistors of the lower circuitry region 305 may include transistors formed or configured in accordance with the transistor structure 200, including such transistors in a CMOS arrangement.

Above the lower circuitry region 305, the memory device 300 may include a stack of decks 315-*a*, where each deck 315-*a* may be located at a different position along the z-direction. The memory device 300 illustrates an example that includes four decks 315-*a* (e.g., decks 315-*a*-1 through 315-*a*-4), but a memory device 100 in accordance with examples as disclosed herein may include any quantity of one or more decks 315. Each deck 315-*a* may include a respective memory array 110-*a*, which may include a plurality of memory cells 105 that are distributed in an xy-plane. In some examples, memory cells 105 of a memory array 110-*a* may be arranged in rows that are aligned along the x-direction and columns that are aligned along the y-direction. Each of the memory arrays 110-*a* may include respective word lines 120 (e.g., along the x-direction), digit lines 130 (e.g., along the y-direction), and plate lines 140 (e.g., where applicable) for accessing the respective memory cells 105, among other circuitry.

The memory arrays 110-*a* of the memory device 300 may include memory cells 105 in accordance with various memory architectures. In some examples, memory cells 105 of a memory array 110-*a* may each include a respective storage component (e.g., a capacitor) and a respective cell selection component (e.g., a cell selection transistor). In some examples (e.g., in an FeRAM application), capacitors of the memory cells 105 may be ferroelectric capacitors operable to store a charge or polarization corresponding to a logic state. A ferroelectric material used in a ferroelectric capacitor may be characterized by an electric polarization where the material maintains a non-zero electric charge in the absence of an electric field. In some examples, memory cells 105 of the memory arrays 110-*a* may include storage elements of different memory architectures, such as linear capacitors (e.g., in a DRAM application), transistors (e.g., in a NAND application, in an SRAM application), or material memory elements (e.g., in a RRAM application or a PCM application, which may include chalcogenide storage elements, resistive storage elements, thresholding storage elements), among other types of storage elements.

In some examples, the decks 315-*a* may include various transistors, such as cell selection transistors of or associated with the memory cells 105 of the respective memory arrays 110-*a*, among other examples. Transistors of the decks 315-*a* may be formed in accordance with various thin film manufacturing techniques, including deposition of polycrystalline semiconductor materials (e.g., polysilicon) over the lower circuitry region 305. In some examples, transistors of the decks 315-*a* may include vertical transistors, which may support a respective channel formed at least in part along the z-direction.

Above the decks 315-*a*, the memory device 300 may include an upper circuitry region 320, which may include second (e.g., upper) set of transistors (e.g., second transistor circuitry, second CMOS circuitry). The second set of transistors may be formed at least in part by a semiconductor material 220 of the upper circuitry region 320 that is deposited over the decks 315-*a*, and that has been heated and cooled to form one or more portions of the semiconductor material 220 in a crystalline arrangement (e.g., a single crystal grain or other continuous atomic arrangement of the semiconductor material 220 that supports the formation of at least one transistor). To support forming the deposited semiconductor material 220 in the crystalline arrangement, the deposited semiconductor may be nearly or partially melted, such that portions of the semiconductor material 220 that are not melted may act as seeds from which a crystalline atomic arrangement may grow (e.g., during cooling of adjacent semiconductor material that has been melted). In some examples, the deposited semiconductor material 220 may be formed or divided in a mesh pattern, such as a formation of a plurality of patches or islands of the semiconductor material 220, which may improve a likelihood that each patch or island is associated with (e.g., includes, is formed with) a single crystalline arrangement from which one or more transistors may be formed (e.g., supporting doped portions 240 being formed from crystalline arrangement of the semiconductor material 220, or an atomic arrangement of the semiconductor material 220 without grain boundaries or with a functionally insignificant quantity or proportion of grain boundaries or other dislocations). In some examples, the processing of (e.g., the heating of) the deposited semiconductor may be configured to prevent, limit, or otherwise mitigate degradation of components or circuitry already formed below the deposited semiconductor material 220 (e.g., of the deck 315-*a*-4), which may include applying a laser with a penetration depth that is less than a thickness of the deposited semiconductor material 220. The second set of transistors of the upper circuitry region 320 may be formed by doping portions of the semiconductor material 220 in the crystalline arrangement. In some examples, transistors of the upper circuitry region 320 may include transistors formed or configured in accordance with the transistor structure 200, including such transistors in a CMOS arrangement.

Above the upper circuitry region 320, the memory device 300 may include an I/O circuitry region 350, which may include circuitry to route signals for communication with a host device coupled to the memory device 300, among other signals. For example, the I/O circuitry region 350 may include one or more pads 360-*a* (e.g., pads 360-*a*-1 through 360-*a*-*n*, conductive interfaces) that support various coupling or electronic communication between the memory device 300 and a host device (e.g., for signaling associated with read or write commands, among other signaling). In some examples, the pads 360-*a* may be associated with signaling of one or more channels (e.g., data channels, control channels) for communicating information, commands, or diagnostic information between the memory device 300 and a host device. In some examples, the pads 360-*a* may be configured for supplying power or voltages to various components of the memory device 300, among other purposes. The I/O circuitry region 350 may include various circuitry for communicating signals with both the upper circuitry region 320 and the lower circuitry region 305. In some examples, the memory device 300 may include a backend interconnect region 330 above the lower circuitry region 305, which may support interconnection between the lower circuitry region 305 and the upper circuitry region 320, or interconnection between the lower circuitry region 305 and the I/O circuitry region 350, or both.

The memory device 300 may use circuitry of the lower circuitry region 305 and the upper circuitry region 320 to access and operate memory cells 105 of the memory arrays 110-*a*. In some examples, circuitry of the lower circuitry region 305, or circuitry of the upper circuitry region 320, or both may include circuitry for performing sense operations, circuitry for performing access operations, circuitry for performing decoding operations, or circuitry for performing I/O operations, or a combination thereof, among other operations. For example, circuitry of the lower circuitry region 305, or circuitry of the upper circuitry region 320, or both may include one or more portions of a row component 125, a column component 135, or a plate component 145, such as decoders, buffers, multiplexers, or drivers (e.g., word line drivers, sub-word line drivers, digit line drivers, sub-digit line drivers, plate line drivers, sub-plate line drivers, among other drivers), among other circuitry configured to address, decode, or bias access lines of one or more memory arrays 110-*a* of the memory device 300. Additionally or alternatively, circuitry of the lower circuitry region 305, or circuitry of the upper circuitry region 320, or both may include one or more portions of a sense component 150, such as one or more sense amplifiers, or one or more signal development components, among other circuitry for sensing or writing to memory cells 105 of the memory device 300.

In some examples, subsets of transistors of the lower circuitry region 305, or of the upper circuitry region 320, or both may be dedicated or allocated for a given purpose (e.g., function, operation). For example, sensing circuitry may include a subset of transistors that are configured to support sense operations, access circuitry (e.g., row access circuitry, column access circuitry, plate access circuitry) may include a subset of transistors that are configured to support activating or biasing access lines, decoding circuitry may include a subset of transistors that are configured to support decoding operations, I/O circuitry may include a subset of transistors that are configured to support I/O operations, and so on. That is, transistors of the lower circuitry region 305, or of the upper circuitry region 320, or both may be divided into various subsets of transistors that each support different operations and functions of the memory device 300.

In some examples, one or more portions of the lower circuitry region 305 may be dedicated or allocated to supporting operation of some memory arrays 110-*a* of the memory device 300 but not others, and one or more portions of the upper circuitry region 320 may be dedicated or allocated to supporting operation of some memory arrays 110-*a* of the memory device 300 but not others. For example, in an example with multiple decks 315-*a*, the decks 315-*a* may be divided into a first set 310-*a* (e.g., a lower set, including decks 315-*a*-1 and 315-*a*-2) and a second set 310-*b* (e.g., an upper set, including decks 315-*a*-3 and 315-*a*-4). In some examples, a division of the decks 315 into sets 310 may refer to how decks 315 are coupled to substrate-based circuitry of the memory device 300. For example, a set 310-*a* may refer to any quantity of decks 315-*a* that are coupled at least in part to lower substrate-based circuitry and a set 310-*b* may refer to any quantity of decks 315-*a* that are coupled at least in part to upper substrate-based circuitry. Although the example of memory device 300 illustrates two sets 310 having a same quantity of decks 315-*a*, in some examples, a memory device 100 may include sets 310 having different quantities of decks 315.

The components and circuitry of the memory device 300 may be coupled through various interconnection regions 370. Each of the interconnection regions 370 may illustrate portions of the memory device 300 that support electrical coupling or interconnection along at least the z-direction between components or circuitry of the illustrated regions. For example, each interconnection region 370 may include various arrangements of TSVs or socket conductors that may be aligned along the z-direction. In some examples, the interconnection regions 370 may include various arrangements of in-plane conductors (e.g., in-plane routing between or among interconnections along the z-direction) that may be aligned in one or more directions parallel to an xy-plane, or combinations thereof.

The interconnection region 370-*a* may illustrate an example of a coupling between each of the memory arrays 110-*a* and the lower circuitry region 305 and the upper circuitry region 320. In some examples, the interconnection region 370-*a* may be an example of a word line socket region which may be used to select and activate one or more word lines of each of the decks 315-*a*, 315-*b*, 315-*c*, and 315-*d*. For example, the interconnection region 370-*a* may include interconnects that couple word lines of decks 315-*a*-1 through 315-*a*-4 to decoders (e.g., row components 125) or word line drivers (e.g., sub-word line drivers) included in the lower circuitry region 305, in the upper circuitry region 320, or both. Although the interconnection region 370-*a* illustrates coupling between the memory arrays 110-*a* and both the lower circuitry region 305 and the upper circuitry region 320, in some examples, an interconnection region 370-*a* may be implemented for coupling between the memory arrays 110-*a* and one of the lower circuitry region 305 or the upper circuitry region 320, but not both (e.g., in examples where CMOS or other circuitry of a row component 125, common to all of the memory arrays 110-*a*, is located in one of the lower circuitry region 305 or the upper circuitry region 320).

The interconnection regions 370-*b* may illustrate examples of a coupling between memory arrays 110-*a* of a set 310 and one of the lower circuitry region 305 or the upper circuitry region 320. In some examples, interconnection regions 370-*b* may be examples of a digit line socket region, which may be used to select and activate one or more digit lines of the decks 315-*a*. For example, the memory device 300 may include an interconnection region 370-*b*-1 that couples digit lines of decks 315-*a*-1 and 315-*a*-2 of the set 310-*a* to decoders (e.g., column components 135), digit line drivers (sub-digit line drivers), sense amplifiers, or a combination thereof, of the lower circuitry region 305. In some examples, the memory device 300 may include an interconnection region 370-*b*-2 that includes interconnects that couple digit lines of decks 315-*a*-3 and 315-*a*-4 of the set 310-*b* to such circuitry of the upper circuitry region 320.

The interconnection region 370-*c* may illustrate an example of a coupling between the lower circuitry region 305 and the upper circuitry region 320. For example, the upper circuitry region 320 may include pad logic or other CMOS circuitry associated with functionality for all of decks 315-*a*-1 through 315-*a*-4, which may be coupled with decks 315-*a*-1 and 315-*a*-2 via the interconnection region 370-*c* and via the lower circuitry region 305. Locating such pad logic or other shared CMOS circuitry in the upper circuitry region 320 may provide favorable proximity to components or circuitry of the I/O circuitry region 350, or may reduce area utilization of a substrate (e.g., a chip or wafer associated with the lower circuitry region 305) for favorable scaling or routing flexibility, or both, among other advantages.

The interconnection region 370-d may illustrate an example of a coupling between the lower circuitry region 305 and the I/O circuitry region 350, and the interconnection region 370-e may illustrate an example of an interconnection between the upper circuitry region 320 and the I/O circuitry region 350.

By including both the lower circuitry region 305 and the upper circuitry region 320, the memory device 300 may support a distribution of transistor circuitry for accessing and operating a stack or multiple decks 315-a between multiple regions or levels of crystalline semiconductor, which may reduce the area or footprint of a substrate (e.g., a chip or wafer) that is occupied by such circuitry. A distribution of circuitry between such regions may enable greater scaling of the memory device 300 (e.g., using a greater quantity of decks 315-a) within a given area or footprint. Moreover, in some examples, pad logic or other circuitry associated with both the lower set 310-a and the upper set 310-b may be included in the upper circuitry region 320 (e.g., rather than being distributed between the upper circuitry region 320 and the lower circuitry region 305, or included entirely in the lower circuitry region 305), which may support allocating more of a lower substrate for other purposes, such as interconnect circuitry that supports an increased quantity of decks 315-a. Moreover, by implementing techniques that partially melt a deposited semiconductor to isolate crystalline seeds or other features from which a crystalline atomic arrangement may grow, certain die structures, such as specifically-formed cooling structures or crystalline nucleation sites in the upper circuitry region 320, may be avoided, and heating of the deposited semiconductor material may be controlled in a manner that limits degradation of structures already formed below the deposited semiconductor (e.g., of the deck 315-a-4 or below).

Figure 4:
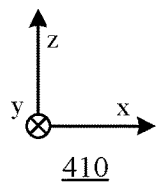
FIG. 4 illustrates an example layout that supports on-die formation of single-crystal semiconductor structures in accordance with examples as disclosed herein.
Figure 4:
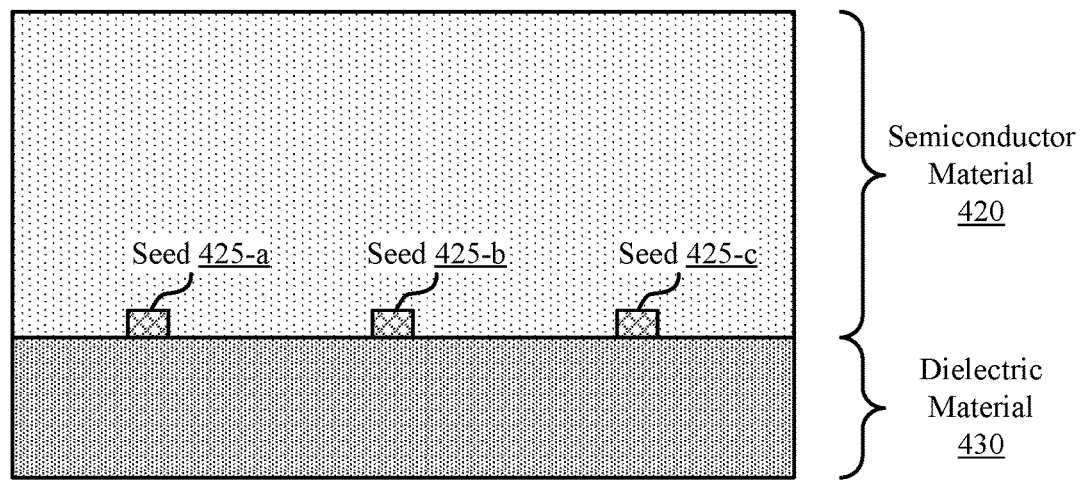

FIG. 4 illustrates an example of a layout 400 that supports on-die formation of single-crystal semiconductor structures in accordance with examples as disclosed herein. The layout 400 may be a portion of a memory device (e.g., a memory device 100, a memory device 300, a memory die), such as a portion of an upper circuitry region 320 described with reference to FIG. 3. However, the described techniques may be implemented to support fabricating other portions of a memory device, or other types of semiconductor apparatuses (e.g., semiconductor dies) that include forming crystalline atomic arrangements of a semiconductor material that is deposited over a substrate. The layout 400 may be described with reference to an x-direction, a y-direction, and a z-direction of a coordinate system 410. Operations described with reference to FIG. 4 may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

The layout 400 illustrates an example of a semiconductor material 420 deposited in contact with (e.g., above, over) a dielectric material 430, where the dielectric material 430 may be deposited over various structures of a memory die (e.g., over one or more memory arrays 110) or other semiconductor die. In some examples, the semiconductor material 420 may be or include silicon (e.g., elemental silicon) or germanium, among other semiconductor materials or combinations thereof, and the dielectric material 430 may be or include an oxide of silicon (e.g., $SiO_2$) or a nitride of silicon (e.g., $Si_3N_4$), among other oxides, nitrides, or other dielectric materials. In some examples, the semiconductor material 420 may be deposited without a particular atomic arrangement, such as depositing the semiconductor material 420 with an amorphous or polycrystalline arrangement. Although the layout 400 shows a single layer of semiconductor material 420 and a single layer of dielectric material 430, in various examples, the described techniques may be supported by formation or deposition of the semiconductor material 420, or the dielectric material 430, or both according to any quantity of one or more layers a same material, or layers of two or more materials, or any combination thereof.

To support forming circuitry from a crystalline arrangement of the semiconductor material 420, the semiconductor material 420 may be nearly or partially melted to support the isolation of seeds 425, from which respective crystalline atomic arrangements may grow to form patches of single crystalline material. For example, based on various techniques for heating the semiconductor material 420, some portions of the semiconductor material 420 may be melted (e.g., transitioned to a liquid phase or state, as illustrated by the region of molten semiconductor) while other portions of the semiconductor material 420 may remain in a solid phase or state (e.g., an as-deposited phase or state, as illustrated by the regions of solid semiconductor, corresponding to seeds 425). In some examples, such heating may be provided by applying a laser to a surface of the semiconductor material 420 (e.g., from above the semiconductor material 420, at least in part along a negative z-direction), which may be used to isolate nuclei (e.g., seeds 425) for single grain crystallization growth. In some examples, seeds 425 may be located along a boundary between the dielectric material 430 and the semiconductor material 420 (e.g., below and between portions of molten semiconductor), which may be associated a relative roughness or other surface irregularity, or some other discontinuity of properties between the semiconductor material 420 and the dielectric material 430, among other factors. In some examples, seeds 425 may be isolated at least in part by a non-uniformity of heating, such as a non-uniformity of an applied laser.

After isolating individual seeds 425 from the deposited semiconductor material 420 (e.g., after a nuclei formation stage), the molten semiconductor may be cooled at a rate that supports a growth of respective crystalline arrangements from each of the seeds 425 (e.g., in a recrystallization stage). In some examples, a rate of cooling of the molten semiconductor may be controlled (e.g., by controlling a process variable such as a fixture temperature or chamber temperature, by a controlling a configuration or formation of materials or structures) or otherwise configured to grow relatively large grains of a crystalline atomic arrangement, which may include preventing or otherwise mitigating further nucleation of other crystalline arrangements (e.g., preventing or mitigating formation of additional grains different than the seeds 425). In some examples, such techniques may be an example of or otherwise described as a liquid phase epitaxy, or a super lateral growth regime, among other techniques for or characterization of heating and cooling (e.g., melting and annealing) to form crystalline atomic arrangements of the deposited semiconductor material 420.

In some examples, the growth of a crystalline atomic arrangements from seeds 425 may be associated with practical limitations on crystalline grain size (e.g., how large a crystalline grain may grow without further nucleation of additional crystalline grains and associated grain boundaries). Further, in some examples, a location of seeds 425, a quantity or density of seeds 425, or a location of grain boundaries between respective crystalline arrangements grown from adjacent seeds, may be relatively unpredictable or indeterminate. Thus, defining locations for transistor structures that avoid grain boundaries (e.g., avoiding grain boundaries or other dislocations in doped portions 240) may be associated with various challenges. Accordingly, techniques for growing respective crystalline atomic arrangements from seeds 425 may be combined with dividing the semiconductor material 420 into patches, which may improve a likelihood that each patch is associated with a single seed 425, or an otherwise dominant seed 425, that supports at least a portion (e.g., a predictable portion) of each patch of the semiconductor material 420 having a single crystalline arrangement. Leveraging such a combination of techniques may therefore improve a likelihood that transistor structures are formed from a portion of the semiconductor material 420 that is free from grain boundaries, or includes a functionally insignificant quantity or proportion of grain boundaries or other dislocations, in locations that are generally predictable as a result of the defined patch locations.

Figure 5A:
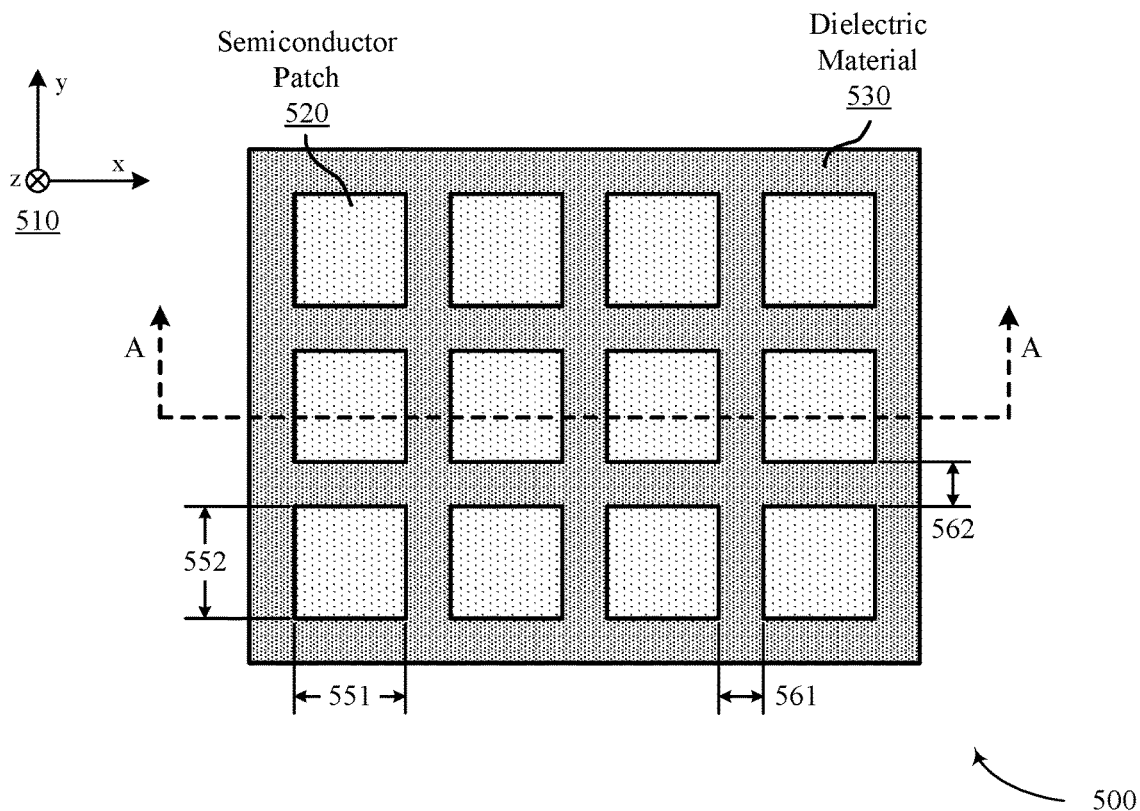
FIGS. 5A and 5B illustrate an example of a layout that support on-die formation of single-crystal semiconductor structures in accordance with examples as disclosed herein.
Figure 5B:
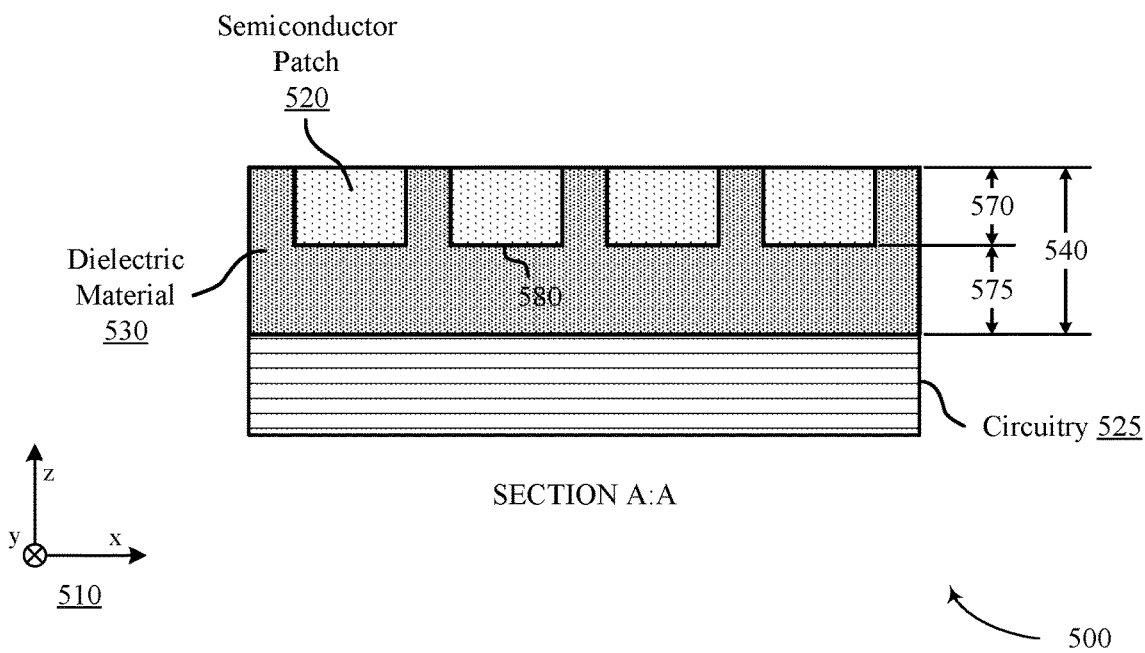

FIGS. 5A and 5B illustrate an example of a layout 500 that supports on-die formation of single-crystal semiconductor structures in accordance with examples as disclosed herein. For example, FIG. 5A may illustrate a top view of the layout 500, and FIG. 5B may illustrate a section view (e.g., a side view) of the layout 500 along a section line A:A. At least some of the layout 500 may be a portion of a memory device (e.g., a memory device 100, a memory device 300, a memory die), such as a portion of an upper circuitry region 320 described with reference to FIG. 3. However, the described techniques may be implemented to support fabricating other portions of a memory device, or other types of semiconductor apparatuses (e.g., semiconductor dies) that include forming crystalline atomic arrangements of a semiconductor material that is deposited over a substrate. The layout 500 may be described with reference to an x-direction, a y-direction, and a z-direction of a coordinate system 510. Operations described with reference to FIGS. 5A and 5B may be performed by a manufacturing system, such as a semiconductor fabrication system configured to perform additive operations such as deposition or bonding, subtractive operations such as etching, trenching, planarizing, or polishing, and supporting operations such as masking, photolithography, or aligning, among other operations that support the described techniques.

The layout 500 illustrates an example of semiconductor patches 520 and a dielectric material 530 that may be in contact with (e.g., around, under, between) the semiconductor patches 520. The dielectric material 530 may be deposited over circuitry 525, which may be an example of, or otherwise include one or more decks 315 of a memory device 300, or may be a portion of circuitry included in an upper circuitry region 320, among other configurations. In some examples, the dielectric material 530 may include silicon dioxide, or another type of dielectric or oxide material. The semiconductor patches 520 and dielectric material 530 may be formed in accordance with various techniques. In some examples, the dielectric material 530 may be deposited over the circuitry 525 with a dimension 540 (e.g., a dielectric deposition thickness along the z-direction), and cavities may be formed (e.g., etched) in the dielectric material 530. In some examples, each of the cavities may be associated with a dimension 570 (e.g., a cavity depth along the z-direction, a patch depth or thickness along the z-direction), a dimension 551 (e.g., a cavity width along the x-direction, a patch width along the x-direction), and a dimension 552 (e.g., a cavity width along the x-direction, a patch width along the x-direction). In some examples, a pattern of the cavities may be associated with a dimension 561 (e.g., a cavity or patch separation distance along the x-direction) and a dimension 562 (e.g., a cavity or patch separation distance along the y-direction). A semiconductor material may be deposited in the cavities to form the semiconductor patches 520. In some examples, such a semiconductor material may be deposited without a particular atomic arrangement, such as depositing the semiconductor material with an amorphous or polycrystalline arrangement In some examples, at least a portion of the dielectric material 530 may be deposited over the circuitry 525 with a dimension 575 (e.g., a first dielectric deposition thickness along the z-direction, a patch isolation or separation distance from the circuitry 525), which may be followed by depositing a layer of semiconductor material along at least a dimension 570 (e.g., a semiconductor deposition or blanket thickness along the z-direction, a patch thickness). In some examples, such a semiconductor material may be deposited without a particular atomic arrangement, such as depositing the semiconductor material with an amorphous or polycrystalline arrangement. The deposited layer of semiconductor material may be patterned (e.g., masked over regions for forming the semiconductor patches 520) and etched (e.g., etching channels or trenches between regions of the semiconductor patches 520, etching through the deposited semiconductor material to the deposited dielectric material) to isolate the semiconductor patches 520 from one another. In some such examples, the dielectric material 530 may include a further deposition of dielectric material, or other material, between the semiconductor patches 520 (e.g., along at least a dimension 570, as a second dielectric deposition thickness along the z-direction) as illustrated, and in other such examples, voids between the semiconductor patches 520 may not be filled (not shown). In these and other examples, forming the layout 500 may include a polishing, planarizing, or other operation to flatten or otherwise modify or characterize a top surface of the layout 500 (e.g., for a finished dimension 570), which may include some degree of material removal.

Each of the semiconductor patches 520 may form a portion of semiconductor material configured to support the formation of respective crystalline arrangements in accordance with one or more techniques disclosed herein. For example, the semiconductor material of each of the semiconductor patches 520 may be nearly or partially melted to support the isolation of seeds 425 (e.g., along an interface 580, at a bottom face of each semiconductor patch 520), which may include the isolation of a single seed 425 for each semiconductor patch 520, or an otherwise dominant seed 425 for each semiconductor patch 520, that supports at least a portion of each semiconductor patch 520 (e.g., a portion of the semiconductor patches 520 used to form transistor structures) having a single or otherwise continuous crystalline arrangement. After isolating seeds 425 for each of the semiconductor patches 520, the molten semiconductor may be cooled at a rate that supports a growth of respective crystalline arrangements for each of the semiconductor patches 520 (e.g., from the respective seeds 425), such as a relatively slow cooling rate. Growth of the crystalline arrangement from each seed 425 may include a lateral growth (e.g., along the x-direction, along the y-direction), a vertical growth (e.g., along the z-direction), or both. In some examples, channel portions of one or more transistors may be formed at least in part by doping regions of the respective crystalline arrangements of the semiconductor patches 520.

The formation of respective crystalline atomic arrangements of each of the semiconductor patches 520 may be supported by various configurations of the layout 500, or various processing parameters associated with the layout 500, or various combinations thereof. For example, techniques or parameters may be implemented to increase a likelihood that each semiconductor patch 520 is associated with a single seed 425, or a single dominant seed 425, from which a continuous crystalline atomic arrangement may grow. Moreover, various techniques may be implemented to increase a likelihood that, after forming or isolating a single seed 425 or a dominant seed 425, a single crystalline arrangement may grow through the respective semiconductor patch 520 without further grain nucleation, grain boundary formation, or other dislocations in the semiconductor material of the semiconductor patch 520. Thus, by balancing various factors in the formation and processing of the semiconductor patches 520, the semiconductor patches 520 may provide well-defined or determinate locations supporting the formation of transistors structures that leverage the performance characteristics provided by a continuous atomic arrangement, such as an atomic arrangement of the semiconductor patches 520 without grain boundaries or with a functionally insignificant quantity or proportion of grain boundaries or other dislocations.

In some examples, certain dimensions of the semiconductor patches 520 may be implemented to support a formation of a continuous crystalline arrangement in each of the semiconductor patches 520. For example, a width of the semiconductor patches 520 may have practical limitations associated with how large a crystalline atomic arrangement may be grown (e.g., along a dimension in an xy-plane), or how likely a given semiconductor patch 520 supports a formation of a single seed 425, among other factors. Accordingly, a width of a semiconductor patch 520 (e.g., a dimension 551, a dimension 552) may have an upper threshold, and accordingly may be defined to be less than some dimension (e.g., less than 20 micrometers). In some examples, a dimension 551, a dimension 552, or both may be defined within a range of dimensions, such as being selected from a range between 5 micrometers and 10 micrometers, or from a range between 2 micrometers and 4 micrometers, among other dimensions or ranges. In some examples, a transistor may have a width of approximately 5 nanometers (e.g., a collective width of doped portions 240), so the described sizes of a semiconductor patch 520 may support a formation many transistors, such as tens of transistors, hundreds of transistors, thousands of transistors, and so on. Although each of the semiconductor patches 520 is illustrated with a square cross-section in an xy-plane, various other shapes may be implemented, including rectangles, circles, ovals polygons, and other shapes. Some examples may implement symmetric shapes (e.g., a square, a circle, a hexagon), which may be beneficial for forming a continuous atomic arrangement, in which case a dimension 551 may be equal to a dimension 552.

In some examples, a separation distance between semiconductor patches 520 may be associated with certain limitations, such as processing limitations. For example, a dimension 561, or a dimension 562, or both may be associated with a threshold channel width (e.g., a dry etch limit) when etching through a deposited layer of semiconductor material to form semiconductor patches 520. Additionally or alternatively, a dimension 561, a dimension 562, or both may be associated with a threshold separation distance between cavities or a threshold width of a dielectric feature between cavities when etching such cavities in a deposited dielectric material for forming semiconductor patches. In some examples, a dimension 561, a dimension 562, or both may a dimension that is at least 5 nanometers, or may be selected from a range between 10 nanometers and 20 nanometers.

In some examples, one or more thickness dimensions may be implemented to support a formation of a continuous crystalline arrangement in each of the semiconductor patches 520, which may be related to heat transfer effects such as a differential temperature along a thickness direction (e.g., along the z-direction) for a given heat flux and thermal conductivity characteristics. For example, a dimension 540 may be selected to be within a range between 10 nanometers and 4 micrometers, which may support a functional balance between melting of the semiconductor patches 520 and heat transfer through the dielectric material 530 (e.g., heat transfer at least in part along a negative z-direction). In some examples, a dimension 570 may be in the range of tens or nanometers to 4 micrometers, which may be associated with a thickness of a blanket of amorphous silicon. In some examples, the dielectric material 530 may be associated with a with a thermal conductivity that is leveraged to manage heat transfer (e.g., heat transfer rate, heat transfer direction) through the layout 500 to support growth of a crystalline semiconductor arrangement, or to prevent thermal degradation of the circuitry 525, or both. Accordingly, a dimension 575 of the dielectric material 530 may be associated with providing a thermal barrier between the heating applied to the semiconductor patches and the circuitry 525, and may be selected to support a rate of heat transfer or temperature decay for a given temperature or energy of molten semiconductor of the semiconductor patches 520. As an illustrative example, after lower deck(s) have been built for a memory device, a low temperature deposition of $SiO_2$ film may deposited with a dimension 575 that is within a range between 1 to 6 micrometers, or up to 10 micrometers, among other examples. In some examples, a semiconductor thickness (e.g., a dimension 570) may be less than or equal to half a thickness of the dielectric material (e.g., a dimension 575, a dimension 540).

In some examples, the semiconductor patches 520 and the dielectric material 530 may be configured with an interface 580 (e.g., an interface along the z-direction, an interface in an xy-plane) that has a continuously flat surface (e.g., where each of the semiconductor patches 520 has a bottom surface in contact with a flat top surface of the dielectric material 530 at a respective interface 580). For example, the described techniques for isolating seeds 425 from a deposited semiconductor material may be performed without the formation of specific nucleation sites or cooling features (e.g., cooling holes. cooling contacts), which may support simplified processing compared to techniques where nucleation sites or cooling features are formed. In some examples, the described techniques may be robust to surface characteristics (e.g., degrees of surface roughness) of the interface 580, such that the interface 580 may not be specifically prepared for isolating seeds 425 or growing a continuous crystalline atomic arrangement.

In some examples, certain parameters for heating of the semiconductor patches 520 may be implemented to support a formation of a continuous crystalline arrangement in each of the semiconductor patches 520. For example, various configurations of laser application may be leveraged to provide a heating of the semiconductor patches 520, for the purpose of melting the semiconductor material, for the purpose of isolating seeds 425 of the semiconductor patches 520, or for the purpose of heating the semiconductor material of the semiconductor patches 520 to a temperature that supports a configured energy or heat transfer for continuous grain growth (e.g., depending on an energy or energy density to be applied to the semiconductor patches 520). In some examples, a laser may be applied with a single pulse (e.g., over a single duration), which may be associated with a single melting of the deposited semiconductor material. In some examples, a laser may be applied with multiple pulses (e.g., over multiple durations of a periodic laser application), which may be associated with more than one melting of the deposited semiconductor material (e.g., where at least a portion of the semiconductor material is melted and solidified multiple times, or may be associated with a single melting of the deposited semiconductor material followed by a lesser degree of heating that supports a heat flux through the deposited semiconductor material for relatively slow cooling and crystallization of the deposited semiconductor material. In some cases, after a first pulse associated with melting the semiconductor material of a semiconductor patch 520, subsequent pulses may preferentially heat or melt solidified semiconductor material at or near grain boundaries, or forming relatively small grains, which may increase a likelihood that each of the semiconductor patches 520 is formed with a single (e.g., dominant) seed 425. As an illustrative example, pulses may be applied with a duration between 50 and 250 nanoseconds (e.g., according to a square wave, a triangle wave, a half-sinusoidal wave, or other periodic application), though other examples may be used (e.g., pulses of 10 nanoseconds or any other duration). In one or more of the pulses, the laser may have a wavelength between 266 nanometers and 550 nanometers, as an illustrative example (e.g., a same wavelength for each pulse, different wavelengths for one or more pulses, among other examples). Although certain aspects are described in the context of pulses of an applied laser, other configurations may be applied, including varying laser power or laser energy density, among other characteristics.

In some examples, the applied laser may be configured with a penetration depth that is less than a thickness of the semiconductor material (e.g., less than a dimension 570), which may avoid or mitigate thermal degradation of the circuitry 525, or may establish a higher temperature of the semiconductor patches 520 near a surface of the semiconductor patches 520 to support a generally downward heat flux (e.g., along a negative z-direction). As illustrative examples, in some implementations, a wavelength of 308 nanometers may be associated with a penetration depth of 6 nanometers, a wavelength of 355 nanometers may result in a penetration depth of 10 nanometers, a wavelength of 532 nanometers may result in a penetration depth of 50 nanometers, and so on (e.g., for amorphous silicon). Thus, to limit a photon penetration depth to be within a depth of the semiconductor patches 520, a wavelength of a laser may be selected or configured to be relatively low (e.g., a wavelength that is less than or equal to 800 nanometers, a wavelength that is less than or equal to 600 nanometers, a wavelength that is or less than or equal to 532 nanometers), or within a corresponding range (e.g., a wavelength between 266 nanometers and 550 nanometers, a wavelength between 300 nanometers and 550 nanometers, a wavelength of 308 nanometers, a wavelength of 355 nanometers, a wavelength of 532 nanometers), which may depend on a thickness of the semiconductor patches 520 (e.g., a dimension 570), or a material characteristic of the semiconductor patches 520, among other factors.

In some examples, a controlled temperature of tooling or fixturing may be implemented to support a formation of a continuous crystalline arrangement in each of the semiconductor patches 520. For example, a rate of cooling of the molten material of the semiconductor patches 520 may be controlled by maintaining a chuck or other fixturing (e.g., in contact with the layout 500 or a semiconductor die that includes the layout 500), or a chamber or other ambient environment, or both at a controlled temperature that may be relatively high, but lower than a temperature of the molten semiconductor materials 515 (e.g., supporting heat flux direction along a negative z-direction through the semiconductor patches 520). As an illustrative example, the heating and cooling may include maintaining a temperature of a fixture, or a chamber, or both within a range between 500 degrees Celsius and 550 degrees Celsius, or within a range between 500 degrees Celsius and 600 degrees Celsius. In some examples, a fixture or chamber temperature may be limited by a temperature sensitivity of the circuitry 525, which may be associated with an upper limit or threshold. Accordingly, a fixture or chamber associated with forming the layout 500 may be maintained at an elevated temperature, but at or below some threshold (e.g., maintained at a temperature of less than or equal to 600 degrees Celsius, among other temperatures).

After forming the respective crystalline atomic arrangements, each of the semiconductor patches 520 may be used to form one or more transistors, such as transistors in accordance with the transistor structure 200, which may include various techniques of doping the semiconductor patches 520. For example, each of the semiconductor patches 520 may be an example of a respective semiconductor material 220, and may be doped to form one or more doped portions 240.

Figure 6:
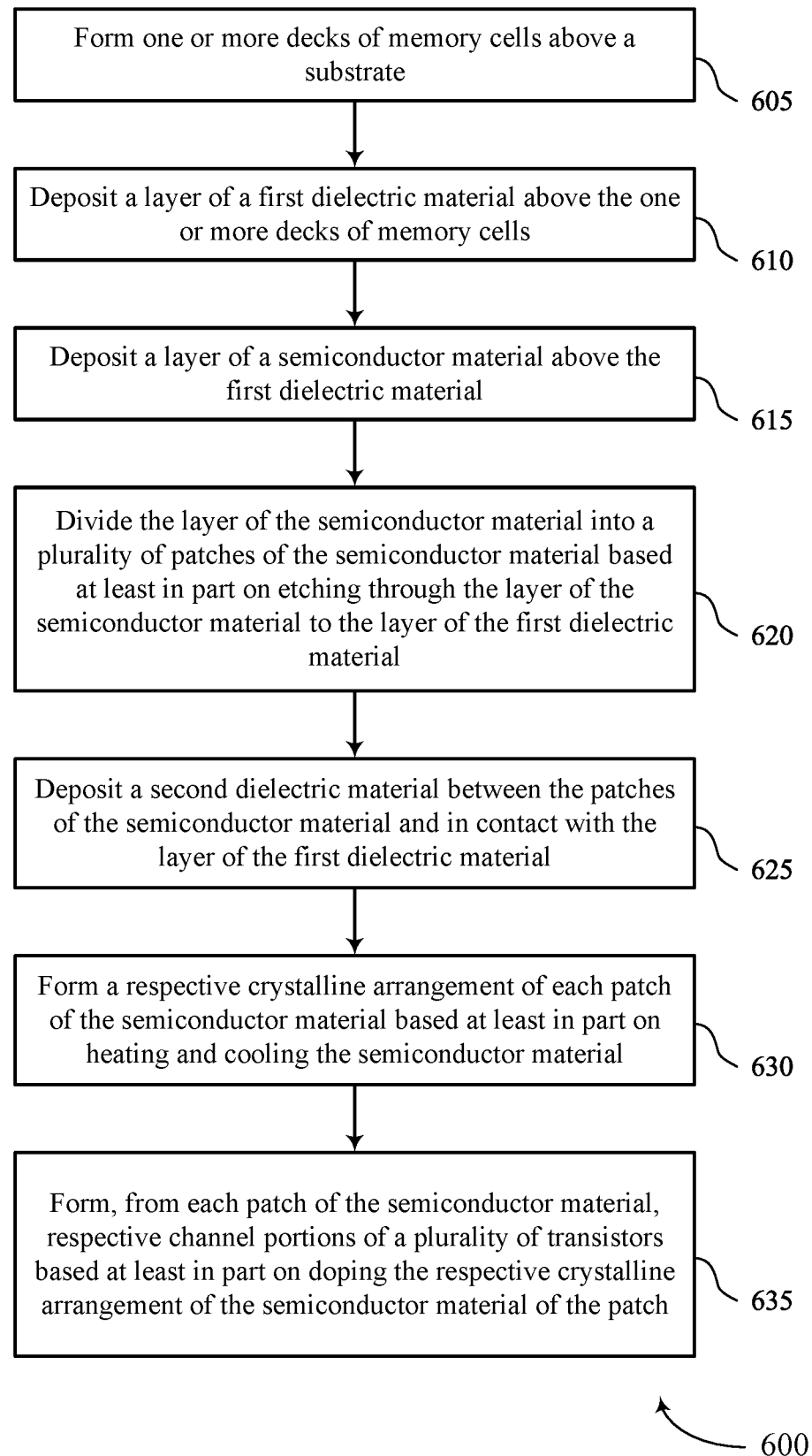
FIGS. 6 and 7 show flowcharts illustrating a method or methods that support on-die formation of single-crystal semiconductor structures in accordance with examples as disclosed herein.

FIG. 6 shows a flowchart illustrating a method 600 that supports on-die formation of single-crystal semiconductor structures in accordance with examples as disclosed herein. The operations of method 600 may be implemented by a manufacturing system or one or more controllers associated with a manufacturing system. For example, the operations of method 600 may be performed by a manufacturing system as described with reference to FIGS. 1 through 5. In some examples, a manufacturing system may execute a set of instructions to control the functional elements of the device to perform the described functions. Additionally or alternatively, the manufacturing system may perform aspects of the described functions using special-purpose hardware.

At 605, the method may include forming one or more decks of memory cells above a substrate. The operations of 605 may be performed in accordance with examples as disclosed herein.

At 610, the method may include depositing a layer of a first dielectric material above the one or more decks of memory cells. The operations of 610 may be performed in accordance with examples as disclosed herein.

At 615, the method may include depositing a layer of a semiconductor material above the first dielectric material. The operations of 615 may be performed in accordance with examples as disclosed herein.

At 620, the method may include dividing the layer of the semiconductor material into a plurality of patches of the semiconductor material based at least in part on etching through the layer of the semiconductor material to the layer of the first dielectric material. The operations of 620 may be performed in accordance with examples as disclosed herein.

At 625, the method may include depositing a second dielectric material between the patches of the semiconductor material and in contact with the layer of the first dielectric material. The operations of 625 may be performed in accordance with examples as disclosed herein.

At 630, the method may include forming a respective crystalline arrangement of each patch of the semiconductor material based at least in part on heating and cooling the semiconductor material. The operations of 630 may be performed in accordance with examples as disclosed herein.

At 635, the method may include forming, from each patch of the semiconductor material, respective channel portions of a plurality of transistors based at least in part on doping the respective crystalline arrangement of the semiconductor material of the patch. The operations of 635 may be performed in accordance with examples as disclosed herein.

In some examples, an apparatus as described herein may perform a method or methods, such as the method 600. The apparatus may include, features, circuitry, logic, means, or instructions (e.g., a non-transitory computer-readable medium storing instructions executable by a processor) for forming one or more decks of memory cells above a substrate, depositing a layer of a first dielectric material above the one or more decks of memory cells, depositing a layer of a semiconductor material above the first dielectric material, dividing the layer of the semiconductor material into a plurality of patches of the semiconductor material based at least in part on etching through the layer of the semiconductor material to the layer of the first dielectric material, depositing a second dielectric material between the patches of the semiconductor material and in contact with the layer of the first dielectric material, forming a respective crystalline arrangement of each patch of the semiconductor material based at least in part on heating and cooling the semiconductor material, and forming, from each patch of the semiconductor material, respective channel portions of a plurality of transistors based at least in part on doping the respective crystalline arrangement of the semiconductor material of the patch.

In some examples of the method 600 and the apparatus described herein forming the respective crystalline arrangements may be based at least in part on growing the respective crystalline arrangements from a respective portion of the semiconductor material that may be not melted by the heating of the semiconductor material.

In some examples of the method 600 and the apparatus described herein, the first dielectric material may include silicon dioxide.

In some examples of the method 600 and the apparatus described herein, the silicon dioxide may be deposited with a thickness between 1 micrometers and 6 micrometers.

In some examples of the method 600 and the apparatus described herein, the silicon dioxide may have a thickness between 1 micrometers and 6 micrometers.

In some examples of the method 600 and the apparatus described herein, depositing the layer of the semiconductor material may include operations, features, circuitry, logic, means, or instructions for depositing silicon with an amorphous arrangement or with a polycrystalline arrangement.

In some examples of the method 600 and the apparatus described herein, the heating of the semiconductor material may be based at least in part on applying a laser to a surface of the semiconductor material with a wavelength that is between 266 nanometers and 550 nanometers.

In some examples of the method 600 and the apparatus described herein, applying the laser to the surface of the semiconductor material may include operations, features, circuitry, logic, means, or instructions for pulsing the laser according to a plurality of cycles.

In some examples of the method 600 and the apparatus described herein, each of the patches may be formed with a width parallel to the substrate that is between 2 micrometers and 4 micrometers.

In some examples of the method 600 and the apparatus described herein, each of the patches may be formed having a square cross-sectional area.

In some examples of the method 600 and the apparatus described herein, a width of the second dielectric material between the patches of the semiconductor material may be between 10 nanometers and 20 nanometers.

In some examples of the method 600 and the apparatus described herein, the heating and the cooling of the semiconductor material may be based at least in part on maintaining a temperature of a fixture in contact with the substrate, during the heating and the cooling of the semiconductor material, within a range between 500 degrees Celsius and 550 degrees Celsius.

Figure 7:
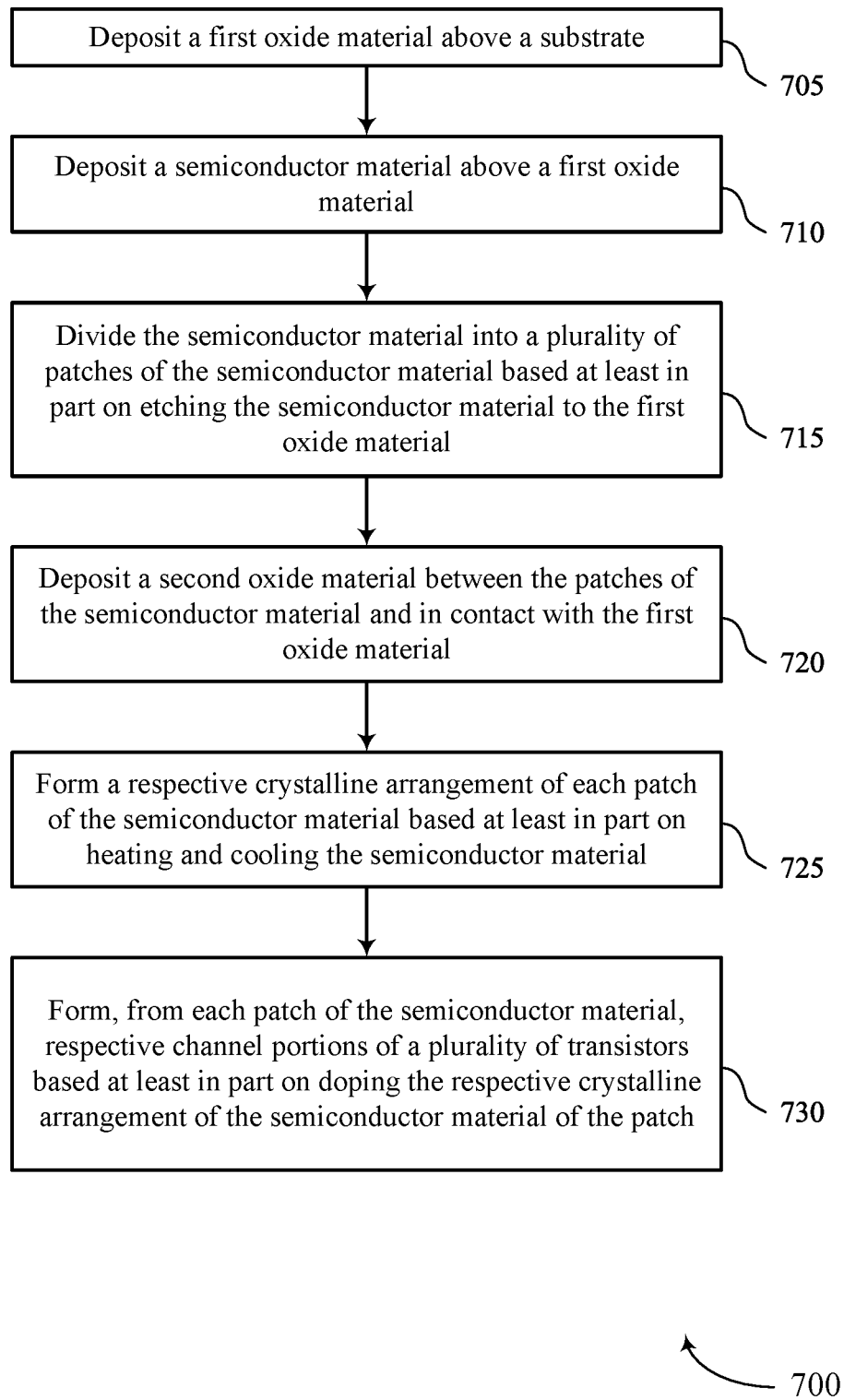

FIG. 7 shows a flowchart illustrating a method 700 that supports on-die formation of single-crystal semiconductor structures in accordance with examples as disclosed herein. The operations of method 700 may be implemented by a manufacturing system or one or more controllers associated with a manufacturing system. For example, the operations of method 700 may be performed by a manufacturing system as described with reference to FIGS. 1 through 5. In some examples, a manufacturing system may execute a set of instructions to control the functional elements of the device to perform the described functions. Additionally or alternatively, the manufacturing system may perform aspects of the described functions using special-purpose hardware At 705, the method may include depositing a first oxide material above a substrate. The operations of 705 may be performed in accordance with examples as disclosed herein.

At 710, the method may include depositing a semiconductor material above a first oxide material. The operations of 710 may be performed in accordance with examples as disclosed herein.

At 715, the method may include dividing the semiconductor material into a plurality of patches of the semiconductor material based at least in part on etching the semiconductor material to the first oxide material. The operations of 715 may be performed in accordance with examples as disclosed herein.

At 720, the method may include depositing a second oxide material between the patches of the semiconductor material and in contact with the first oxide material. The operations of 720 may be performed in accordance with examples as disclosed herein.

At 725, the method may include forming a respective crystalline arrangement of each patch of the semiconductor material based at least in part on heating and cooling the semiconductor material. The operations of 725 may be performed in accordance with examples as disclosed herein.

At 730, the method may include forming, from each patch of the semiconductor material, respective channel portions of a plurality of transistors based at least in part on doping the respective crystalline arrangement of the semiconductor material of the patch. The operations of 730 may be performed in accordance with examples as disclosed herein.

In some examples, an apparatus as described herein may perform a method or methods, such as the method 700. The apparatus may include, features, circuitry, logic, means, or instructions (e.g., a non-transitory computer-readable medium storing instructions executable by a processor) for depositing a first oxide material above a substrate, depositing a semiconductor material above a first oxide material, dividing the semiconductor material into a plurality of patches of the semiconductor material based at least in part on etching the semiconductor material to the first oxide material, depositing a second oxide material between the patches of the semiconductor material and in contact with the first oxide material, forming a respective crystalline arrangement of each patch of the semiconductor material based at least in part on heating and cooling the semiconductor material, and forming, from each patch of the semiconductor material, respective channel portions of a plurality of transistors based at least in part on doping the respective crystalline arrangement of the semiconductor material of the patch.

In some examples of the method 700 and the apparatus described herein, depositing the semiconductor material may include operations, features, circuitry, logic, means, or instructions for depositing the semiconductor material in contact with a continuously flat surface of the first oxide material.

In some examples of the method 700 and the apparatus described herein, the semiconductor material may be deposited with a thickness that is less than or equal to half of a thickness of the first oxide material.

In some examples of the method 700 and the apparatus described herein, heating the semiconductor material may include operations, features, circuitry, logic, means, or instructions for applying a laser to the semiconductor material with a penetration depth that is less than a thickness of the semiconductor material.

In some examples of the method 700 and the apparatus described herein, the heating of the semiconductor material may be based at least in part on applying a laser to a surface of the semiconductor material with a wavelength that is less than or equal to 600 nanometers.

In some examples of the method 700 and the apparatus described herein, each of the patches of the semiconductor material may be formed with a width that is less than or equal to 20 micrometers.

In some examples of the method 700 and the apparatus described herein, the heating and cooling of the semiconductor material may be based at least in part on maintaining temperature of a fixture in contact with the substrate to less than or equal to 600 degrees Celsius.

It should be noted that the methods described herein describe possible implementations, and that the operations and the steps may be rearranged or otherwise modified and that other implementations are possible. Further, portions from two or more of the methods may be combined.

Another apparatus is described. The apparatus may include a deck of memory cells, a dielectric portion above the deck of memory cells, a semiconductor portion above the dielectric portion and including a plurality of single crystal patches each having a bottom surface in contact with a flat top surface of the dielectric portion, and a plurality of transistors coupled with the deck of memory cells. In some examples, each transistor of the plurality of transistors may include a first terminal in contact with a respective first doped portion of one of the plurality of single crystal patches, a second terminal in contact with a respective second doped portion of the one of the plurality of single crystal patches, and a gate conductor operable to modulate a conductivity of a respective third doped portion of the one of the plurality of single crystal patches that is between the respective first doped portion and the respective second doped portion.

In some examples of the apparatus, the plurality of transistors includes a first set of multiple transistors each associated with a respective first doped portion of a first single crystal patch, a respective second doped portion of the first single crystal patch, and a respective third doped portion of the first single crystal patch and a second set of multiple transistors each associated with a respective first doped portion of a second single crystal patch, a respective second doped portion of the second single crystal patch, and a respective third doped portion of the second single crystal patch.

In some examples of the apparatus, the first dielectric material may include silicon dioxide. In some examples, the silicon dioxide many have a thickness between 1 micrometer and 6 micrometers.

In some examples of the apparatus, each of the patches may have a width between 2 micrometers and 4 micrometers.

In some examples of the apparatus, each of the patches may have a square cross-sectional area.

In some examples or the apparatus, a width of the second dielectric material between the patches of the semiconductor material may be between 10 nanometers and 20 nanometers.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an ASIC, a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   forming one or more decks of memory cells above a substrate;
   depositing a layer of a first dielectric material above the one or more decks of memory cells;
   depositing a layer of a semiconductor material above the first dielectric material;
   dividing the layer of the semiconductor material into a plurality of patches of the semiconductor material based at least in part on etching through the layer of the semiconductor material to the layer of the first dielectric material;
   depositing a second dielectric material between the patches of the semiconductor material and in contact with the layer of the first dielectric material;
   forming a respective crystalline arrangement of each patch of the semiconductor material based at least in part on heating and cooling the semiconductor material; and
   forming, from each patch of the semiconductor material, respective channel portions of a plurality of transistors based at least in part on doping the respective crystalline arrangement of the semiconductor material of the patch.

2. The method of claim 1, wherein forming the respective crystalline arrangement of each patch is based at least in part on growing the respective crystalline arrangement of each patch from a respective portion of the semiconductor material that is not melted by the heating of the semiconductor material.

3. The method of claim 1, wherein the first dielectric material comprises silicon dioxide.

4. The method of claim 3, wherein the silicon dioxide is deposited with a thickness between 1 micrometers and 6 micrometers.

5. The method of claim 1, wherein depositing the layer of the semiconductor material comprises:
   depositing silicon with an amorphous arrangement or with a polycrystalline arrangement.

6. The method of claim 1, wherein the heating of the semiconductor material is based at least in part on applying a laser to a surface of the semiconductor material with a wavelength that is between 266 nanometers and 550 nanometers.

7. The method of claim 6, wherein applying the laser to the surface of the semiconductor material is based on pulsing the laser according to a plurality of cycles.

8. The method of claim 1, wherein each of the patches is formed with a width parallel to the substrate that is between 2 micrometers and 4 micrometers.

9. The method of claim 1, wherein each of the patches is formed having a square cross-sectional area.

10. The method of claim 1, wherein a width of the second dielectric material between the patches of the semiconductor material is between 10 nanometers and 20 nanometers.

11. The method of claim 1, wherein the heating and the cooling of the semiconductor material is based at least in part on maintaining a temperature of a fixture in contact with the substrate, during the heating and the cooling of the semiconductor material, within a range between 500 degrees Celsius and 550 degrees Celsius.

12. A method, comprising:
    depositing a first oxide material above a substrate;
    depositing a semiconductor material above a first oxide material;
    dividing the semiconductor material into a plurality of patches of the semiconductor material based at least in part on etching the semiconductor material to the first oxide material;
    depositing a second oxide material between the patches of the semiconductor material and in contact with the first oxide material;
    forming a respective crystalline arrangement of each patch of the semiconductor material based at least in part on heating and cooling the semiconductor material; and
    forming, from each patch of the semiconductor material, respective channel portions of a plurality of transistors based at least in part on doping the respective crystalline arrangement of the semiconductor material of the patch.

13. The method of claim 12, wherein depositing the semiconductor material comprises:
    depositing the semiconductor material in contact with a continuously flat surface of the first oxide material.

14. The method of claim 12, wherein the semiconductor material is deposited with a thickness that is less than or equal to half of a thickness of the first oxide material.

15. The method of claim 12, wherein heating the semiconductor material comprises:
    applying a laser to the semiconductor material with a penetration depth that is less than a thickness of the semiconductor material.

16. The method of claim 12, wherein the heating of the semiconductor material is based at least in part on applying a laser to a surface of the semiconductor material with a wavelength that is less than or equal to 600 nanometers.

17. The method of claim 12, wherein each of the patches of the semiconductor material is formed with a width that is less than or equal to 20 micrometers.

18. The method of claim 12, wherein the heating and cooling of the semiconductor material is based at least in part on maintaining temperature of a fixture in contact with the substrate to less than or equal to 600 degrees Celsius.

* * * * *